(12) United States Patent
Yanagi

(10) Patent No.: US 9,863,034 B2
(45) Date of Patent: Jan. 9, 2018

(54) VACUUM VAPOR DEPOSITION METHOD

(71) Applicant: MITSUBISHI HEAVY INDUSTRIES, LTD., Tokyo (JP)

(72) Inventor: Yuji Yanagi, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/689,389

(22) Filed: Apr. 17, 2015

(65) Prior Publication Data

US 2015/0218691 A1     Aug. 6, 2015

Related U.S. Application Data

(62) Division of application No. 12/816,470, filed on Jun. 16, 2010, now abandoned.

(30) Foreign Application Priority Data

Jul. 10, 2009    (JP) .................. 2009-163239

(51) Int. Cl.
| | |
|---|---|
| *C23C 14/24* | (2006.01) |
| *C23C 14/12* | (2006.01) |
| *C23C 14/54* | (2006.01) |

(52) U.S. Cl.
CPC ............. *C23C 14/24* (2013.01); *C23C 14/12* (2013.01); *C23C 14/243* (2013.01); *C23C 14/543* (2013.01)

(58) Field of Classification Search
CPC ............................. C23C 14/24; C23C 14/543
See application file for complete search history.

(56) References Cited

U.S. PATENT DOCUMENTS

| | | |
|---|---|---|
| 4,217,855 A | 8/1980 | Takagi |
| 5,556,472 A | 9/1996 | Nakamura et al. |
| (Continued) | | |

FOREIGN PATENT DOCUMENTS

| | | |
|---|---|---|
| EP | 2 065 487 | 6/2009 |
| JP | 2002-348658 | 12/2002 |
| (Continued) | | |

OTHER PUBLICATIONS

Nakahata, Takumi, et al., "Si Deposition into Fine Contact Holes by Ultrahigh-Vacuum Chemical Vapor Deposition". Jpn. J. Appl. Phys., vol. 38 (1999) pp. 4045-4056.*

(Continued)

*Primary Examiner* — Bret P Chen
(74) *Attorney, Agent, or Firm* — Wenderoth, Lind & Ponack, L.L.P.

(57) ABSTRACT

In a vacuum vapor deposition method which is carried out at a vacuum vapor deposition apparatus including a plurality of linear-shaped vaporization sources, an equal-thickness surface is calculated with respect to each of a polarity of release holes. The equal-thickness surface indicates a surface where a deposition amount of vapor of a vaporization material released from the corresponding release hole is the same per unit time. Then, the vaporization containers are placed in such a manner that contact points of the equal-thickness surfaces all coincide with each other on a deposition surface of a substrate, each of the contact points being where the corresponding equal-thickness surface comes in contact with the surface of the substrate.

8 Claims, 8 Drawing Sheets

(56) References Cited

U.S. PATENT DOCUMENTS

| | | | |
|---|---|---|---|
| 7,091,134 B1* | 8/2006 | Meinhold | B41J 2/04506 438/14 |
| 7,339,139 B2 | 3/2008 | Yang et al. | |
| 2002/0179013 A1 | 12/2002 | Kido et al. | |
| 2003/0015140 A1 | 1/2003 | Van Slyke et al. | |
| 2004/0191407 A1* | 9/2004 | Ohbayashi | C23C 14/243 427/10 |
| 2005/0005848 A1 | 1/2005 | Yamazaki et al. | |
| 2006/0045958 A1 | 3/2006 | Abiko et al. | |
| 2007/0134405 A1* | 6/2007 | Otsuka | C23C 14/24 427/64 |
| 2009/0133629 A1* | 5/2009 | Kamikawa | C23C 14/12 118/718 |
| 2010/0170444 A1 | 7/2010 | Negishi | |

FOREIGN PATENT DOCUMENTS

| | | | |
|---|---|---|---|
| JP | 2003-301255 | | 10/2003 |
| JP | 2004-301255 | | 10/2003 |
| JP | 2004-095275 | | 3/2004 |
| JP | 2004-327272 | | 11/2004 |
| JP | 2006-057173 | | 3/2006 |
| JP | 2006-249572 | * | 9/2006 |
| JP | 2007-46100 | | 2/2007 |
| JP | 2007-146219 | | 6/2007 |
| JP | 2009-127066 | | 6/2009 |
| KP | 10-0467805 | | 1/2005 |
| KR | 10-2009-0047953 | | 5/2009 |
| KR | 2009-0047953 | * | 5/2009 |

OTHER PUBLICATIONS

Japanese Office Action dated Jun. 14, 2011 in corresponding Japanese Patent Application No. 2009-163239 with English translation.
European Search Report dated Oct. 14, 2010 in corresponding European Application No. 10167474.5.
Korean Office Action dated Mar. 20, 2012 in corresponding Korean Patent Application No. 10-2010-0061740 with English translation.
Office Action dated May 2, 2013 in corresponding Korean Application No. 10-2012-0120602, with English translation thereof.

* cited by examiner

VACUUM VAPOR DEPOSITION METHOD

TECHNICAL FIELD

This application is a divisional of U.S. application Ser. No. 12/816,470 filed on Jun. 16, 2010, which claims priority to Japanese priority application No. 2009-163239 filed on Jul. 10, 2009, which is hereby incorporated by reference.

The present invention relates to a vacuum vapor deposition method which forms a thin film by depositing multiple vaporization materials simultaneously on a deposition target such as a substrate.

BACKGROUND ART

A vacuum vapor deposition apparatus is an apparatus for forming a thin film as follows. First, a deposition target and a vaporization container containing a vaporization material are placed inside a vacuum chamber in the apparatus. Then, while the inside of the vacuum chamber is depressurized, the vaporization container is heated to melt and vaporize the vaporization material through evaporation or sublimation. The vaporized material is then deposited on a surface of the deposition target to thereby form a thin film. As a method of heating the vaporization container, the vacuum vapor deposition apparatus employs methods such as an external heating method using an external heater to heat the vaporization container containing the vaporization material. In recent years, vacuum vapor deposition apparatuses have been used not only to form metal thin films and oxide thin films using metal materials, but also to form organic thin films by depositing organic materials, as well as to form small molecular organic thin films by simultaneously depositing multiple organic materials. For example, vacuum vapor deposition apparatuses are used to form organic electroluminescent elements (hereinafter, referred to as organic EL elements) for flat panel displays.

The vacuum vapor deposition apparatus is also capable of forming a thin film by simultaneously depositing multiple vaporization materials on a substrate or the like (simultaneous deposition). For example, when a luminescent layer is to be formed through a deposition process for an organic EL element, a host material and a luminescent material are used as the vaporization materials. These materials are simultaneously deposited to form the luminescent layer. Thus, information of a luminescent layer, the mixing ratio of a host material and a luminescent material is an important factor that influences the properties of the luminescent layer.

CITATION LIST

Patent Literatures

Patent Literature 1 Japanese Patent Application Publication No. 2004-095275
Patent Literature 2 Japanese Patent Application Publication No. 2002-348658
Patent Literature 3 Japanese Patent Application Publication No. 2006-57173
Patent Literature 4 Japanese Patent Application Publication No. 2006-249572
Patent Literature 5 Japanese Patent Application Publication No. 2009-127066

SUMMARY OF INVENTION

Technical Problem

As the screen sizes of flat panel displays such as liquid crystal displays increase, the substrates used therefore also increase in size. Similarly, larger substrates are desired for organic EL elements, which are also applicable to displays and illuminations. In an organic EL display, thin films need to be deposited uniformly and homogeneously on a substrate. However, the larger the substrates become, the more difficult it becomes to form uniform and homogeneous thin films. There have been increasing demands for higher panel qualities particularly in recent years, requiring further increase in the uniformity and homogeneousness.

A conventional vacuum vapor deposition apparatus (Patent Literature 1) includes a vaporization source which allows a vaporization material to be vaporized through linearly-arranged multiple openings. The vaporized material is then deposited on a large substrate by moving the vaporization source and the substrate relative to each other, whereby a thin film having a relatively uniform film thickness is formed. In recent years, there have been demands to reduce manufacturing cost by improving the utilization of expensive organic materials, and also to improve productivity through high-rate film formation. These demands have been satisfied by reducing the distance between a vaporization source and a substrate. However, in a case of performing simultaneous deposition by arranging two linear-shaped vaporization sources side by side, it is not easy to form a homogeneous thin film with this type of apparatus. This is because a mixing ratio of deposited vaporization materials changes in the film thickness direction (details will be explained later by use of FIG. 5).

The present invention has been made in view of the above circumstances, and has an object to provide a vacuum vapor deposition method capable of forming a homogeneous thin film having a constant mixing ratio of multiple vaporization materials in the film thickness direction, when mixing and depositing the vaporization materials using multiple linear-shaped vaporization sources.

Solution to Problem

In a vacuum vapor deposition method for solving the above problem according to a first invention, a plurality of vaporization containers each containing a vaporization material and having a plurality of release holes arranged linearly are placed in parallel with arrangement directions of the plurality of release holes. The vaporization containers are heated to evaporate or sublimate the respective vaporization materials, and vapors of the respective materials are released through the plurality of release holes. Moreover, the vaporization materials are mixed together and deposited on an entire surface of a substrate by relatively moving the substrate and the vaporization containers in a direction perpendicular to the arrangement directions of the plurality of release holes. The method is characterized in that equal-thickness surfaces (or equal film thickness surfaces) are calculated for the vaporization containers, respectively, each of the equal-thickness surfaces indicating where a deposition amount of the vapor (or film thickness) of the vaporization material released from the release holes in the corresponding vaporization container is the same per unit time. In addition, the vaporization containers are placed in such a manner that contact points of the respective equal-thickness surfaces all coincide with each other on the surface of the substrate, each of the contact points indicating where the corresponding equal-thickness surfaces come in contact with the surface of the substrate.

A vacuum vapor deposition method for solving the above problem according to a second invention provides the vacuum vapor deposition method described in the first invention having the following features. In a case where the vaporization containers include nozzles projecting from the vaporization containers and where the release holes are provided to penetrate through the nozzles, the vaporization containers are placed to stand vertically and the nozzles are tilted in such a manner that the contact points of the respective equal-thickness surfaces all coincide with each other on the surface of the substrate. Here, each of the contact points indicates where the corresponding equal-thickness surfaces come in contact with the surface of the substrate.

A vacuum vapor deposition method for solving the above problem according to a third invention provides the vacuum vapor deposition method described in the first invention having the following features. The vaporization containers each include therein a current plate having a plurality of passage holes through which the corresponding vapor passes. In addition, as conductance per unit length in the arrangement directions of the plurality of release holes, conductance by the passage holes is made proportional to conductance by the release holes.

Advantageous Effects of Invention

According to the first and second features, the vaporization containers are placed in such a manner that contact points of the equal-thickness surfaces, at which they come in contact with the surface of the substrate, would coincide with each other on the surface of the substrate. Here, each equal-thickness surface indicates where the deposition amount of the vapor of the corresponding vaporization material is the same per unit time. This allows formation of a homogeneous thin film having a substantially constant mixing ratio of the vaporization materials. As a result, an organic EL element with a higher quality is manufactured.

According to the third feature, the vaporization containers each include therein the current plate having the multiple passage holes, and as conductance per unit length in the longitudinal directions of the vaporization containers, conductance by the passage holes is made proportional to conductance by the release holes. This allows control on the distribution of the vapor of each vaporization material in the longitudinal direction even when the vaporization state of the vaporization material is changed in the linear vaporization container in the longitudinal direction (the arrangement direction of the multiple release holes). Hence, a thin film having a more uniform film thickness distribution in the longitudinal direction can be achieved also for a large substrate. As a result, an element which is homogeneous and having uniform properties is formed.

BRIEF DESCRIPTION OF DRAWINGS

FIG. 4A is a cross-sectional view of the vaporization container in its longitudinal direction. FIG. 4B is a top view of the vaporization container. FIG. 4C is a top view of a current plate inside the vaporization container.

DESCRIPTION OF EMBODIMENTS

Embodiments of a vacuum vapor deposition method according to the present invention will be described in detail with reference to FIGS. 1 to 10.

FIRST EXAMPLE

Figure 1:
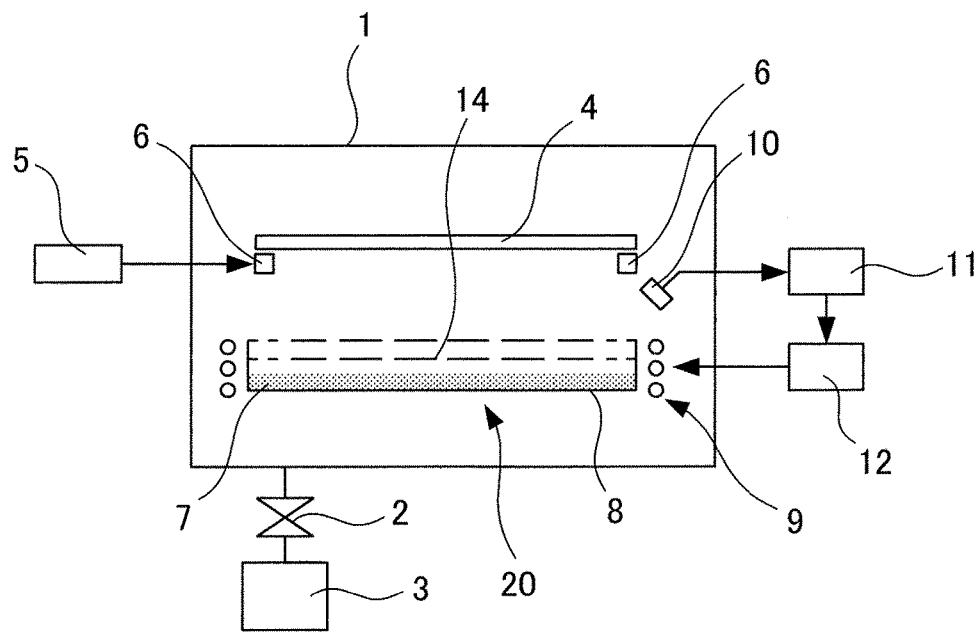
FIG. 1 is a schematic configuration diagram showing an exemplary embodiment of a vacuum vapor deposition apparatus which carries out a vacuum vapor deposition method according to the present invention.

FIG. 1 is a schematic configuration diagram showing the configuration of a vacuum vapor deposition apparatus which carries out a vacuum vapor deposition method of a first example. FIG. 1 shows a cross section taken along a plane perpendicular to the transport direction of a substrate in the vacuum vapor deposition apparatus. The vacuum vapor deposition apparatus which carries out a vacuum vapor deposition method of the first example is installed as a part (vacuum vapor deposition apparatus section) of an inline system for forming organic EL elements. Thus, the vacuum vapor deposition apparatus which carries out a vacuum vapor deposition method of the first example will be described below by taking formation of an organic EL element as an example; however, the vacuum vapor deposition apparatus which carries out a vacuum vapor deposition method of the first example is not limited to this, and is applicable to formation of a metal thin film of a metal material, an insulating thin film of an insulating material, and the like. The vacuum vapor deposition apparatus which carries out a vacuum vapor deposition method of the first example is also applicable to deposition using only one vaporization material as well as to deposition using multiple vaporization materials (multi-source simultaneous deposition; also called co-deposition in a case of two vaporization materials).

The inline system includes multiple processing apparatuses (e.g., a vacuum vapor deposition apparatus, and the like). The whole system is configured by a vacuum chamber through which multiple substrates are transported continuously, each substrate being subjected to successive processes for formation of organic EL elements (e.g., formation of luminescent layers as organic thin films, formation of electrodes as metal thin films, and the like). These processes require structures for carrying in the substrates from the atmosphere side to the vacuum chamber and for carrying out the substrates from the vacuum chamber, such as a charging chamber and a discharging chamber. These structures maybe obtained by known techniques, and thus illustration thereof is omitted here.

In the vacuum vapor deposition apparatus for forming an organic thin film for an organic EL element, for example, a vacuum chamber 1 is connected to a vacuum pump 3 via a valve 2 as shown in FIG. 1, allowing the inside of the vacuum chamber 1 to be evacuated to a high vacuum state. A substrate 4 on which to deposit an organic thin film is positioned on the center of an unillustrated tray. With rotation of transport rollers 6 driven by a drive source 5, the substrate 4 is transported together with the tray from the front side toward the further side of FIG. 1. Note that in the first example, vaporization sources 20 to be described later are fixed at certain positions and the substrate 4 is caused to move; in contrast, the substrate 4 may be fixed at a certain position and the vaporization sources 20 may be caused to move.

Below a path of the substrate 4, arranged are the vaporization sources 20 each including a vaporization container 8 in which a vaporization material is contained, a heater 9 for heating placed around each vaporization container 8, and the like. Each vaporization source 20 is formed as a linear-shaped vaporization source elongated in the horizontal direction (hereinafter, referred to as a board width direction of the substrate 4) perpendicular to the transport direction of the substrate 4, and has a length equal to or slightly greater than the length of the substrate 4 in the board width direction. In a case of multi-source simultaneous deposition, multiple vaporization sources 20 are arranged in parallel with the board width direction of the substrate 4 as shown in FIGS. 5 and 6 to be described later.

Above each vaporization container 8, provided is a vaporization rate detector 10 (e.g., crystal monitor head or the like) to detect the vaporization rate of the corresponding vaporization material 7 vaporized from the vaporization container 8. This vaporization rate detector 10 is connected to a vaporization rate controller 11. The vaporization rate controller 11 controls the control output to a heating power source 12 on the basis of the vaporization rate detected by the vaporization rate detector 10 so that the vaporization rate would remain at a predetermined value. The heating power source 12 feeds the heater 9 with the power controlled on the basis of the control output so that the vaporization rate would remain constant. Here, the control described above refers to control of temperature at the time of deposition. Meanwhile, in a case of controlling the temperature until the temperature of the vaporization container 8 reaches a vaporization temperature, i.e., control of temperature rising, the temperature is controlled by switching the control means for controlling the heating power source 12 to a thermocouple and a temperature controller (both unillustrated) provided to a bottom portion of the vaporization container. In a case of multi-source simultaneous deposition, each individual vaporization source 20 is provided with the above-mentioned heating mechanism and the control mechanisms.

When each vaporization container 8 is heated using the vaporization rate detector 10, the vaporization rate controller 11, the heating power source 12, and the heater 9 as described above, the vaporization material 7 contained in the vaporization container 8 is evaporated or sublimated. The vapor of the vaporization material 7 is then released in accordance with a constant vaporization rate through multiple release holes 13 to be described later. The board width direction of the substrate 4 is the same as the direction in which the multiple release holes 13 are arranged. The substrate 4 and each vaporization source 20 are caused to relatively move in the direction perpendicular to the board width direction and the direction in which the release holes 13 are arranged. Hence, the vaporization materials 7 vaporized from the respective vaporization sources 20 are mixed together and deposited on the entire surface of the substrate 4.

Next, a structure of the vaporization source 20 will be described in detail using FIGS. 2 to 4C.

Figure 2:
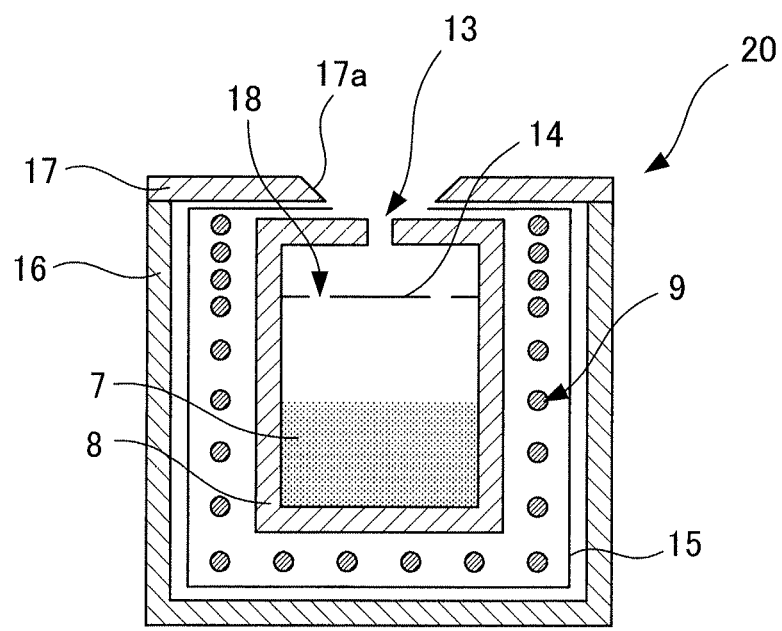
FIG. 2 is a cross-sectional view showing an example of a linear-shaped vaporization source of the vacuum vapor deposition apparatus which carries out a vacuum vapor deposition method according to the present invention.

FIG. 2 is a cross-sectional view of the vaporization source of the first example, taken along a plane perpendicular to the longitudinal direction of the linear vaporization source. In a case of multi-source simultaneous deposition, each vaporization source has the same structure.

The vaporization container 8 placed inside the vaporization source 20 is formed to be elongated in the board width direction of the substrate 4, and has a length equal to or slightly greater than the length of the substrate 4 in the board width direction. The multiple release holes 13 are provided in an upper surface (surface on the substrate 4 side) of the vaporization container 8. A current plate 14 having multiple passage holes 18 is placed between the release holes 13 and the vaporization material 7 inside the vaporization container 8. As will be explained using later-described FIGS. 4A to 4C, the positions of the release holes 13 and the passage holes 18 in the longitudinal direction are arranged in such a manner that the film thickness distribution of a thin film formed by deposition of the vaporization material 7 would be uniform in the board width direction of the substrate 4.

For installation and removal of the vaporization container 8 as well as for the arrangement of the release holes 13, the heater 9 is not placed above the vaporization container 8. Accordingly, in order to compensate temperature decrease in the release holes 13, the heater 9 is disposed densely on the release holes 13 side and the lower heater 9 is disposed sparsely on a lower side (on the vaporization material 7 side). Such disposition prevents temperature decrease in the release holes 13 and thus avoids clogging of the release holes 13 by the vaporization material 7. The heater 9 and the heating power source 12 will be further described later using FIGS. 3A and 3B.

In addition, a radiation preventive plate 15 is placed around the entire surface of the outer periphery of the heater 9 except a part immediately above the release holes 13. This radiation preventive plate 15 functions to preserve and equalize the heat of the vaporization container 8. Moreover, an outer periphery of the radiation preventive plate 15 is covered by a water-cooling jacket 16 and a heat insulating plate 17. The water-cooling jacket 16 has therein a passage (unillustrated) through which cooling water flows and is cooled by the cooling water. The heat insulating plate 17 has opening portions 17a at positions corresponding to the arrangement positions of the release holes 13 and is in contact with an upper opening portion of the water-cooling jacket 16. The water-cooling jacket 16 and the heat insulating plate 17 function to prevent heat radiation to the vacuum chamber 1 and the substrate 4. A material having high heat conductivity, such as aluminum, is suitable for the heat insulating plate 17. Note that the opening portions 17a in the heat insulating plate 17 are each formed into a tapered shape becoming wider toward the substrate 4 in order to avoid the vapor of the vaporization material 7 adhering thereto.

Figure 3A:
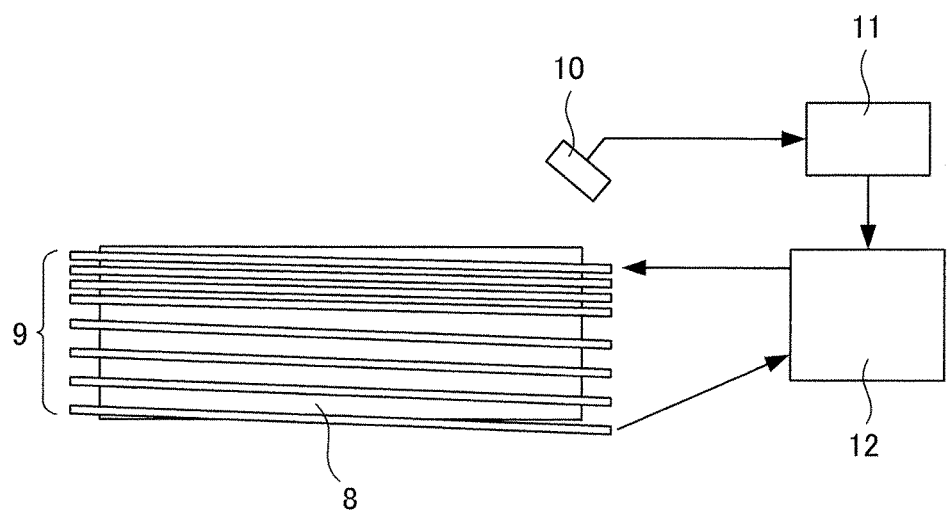
FIG. 3A is a diagram for explaining a configuration of a heating mechanism and a control mechanism in a vaporization container of the vacuum vapor deposition apparatus which carries out a vacuum vapor deposition method according to the present invention.

Next, a configuration of the heating mechanism and the control mechanism in the vaporization container 8 will be described with reference to FIG. 3A. FIG. 3A is a diagram for explaining the configuration of the heating mechanism and the control mechanism of the first example.

The release holes 13 in the vaporization container 8 are exposed to the substrate 4 to be subjected to deposition. Thus, if no countermeasure is taken, the temperature near the release holes 13 become lower than that inside the vaporization container 8. Moreover, when the vaporization container 8 is elongated, a temperature variation is likely to occur in the longitudinal direction. As a countermeasure, described in Patent Literature 1 is a method by which multiple temperature control means are provided separately in the longitudinal direction and vaporization rate control is performed for each separate region. However, in reality, it is extremely difficult to control the temperature on heaters by detecting the vaporization rate for each separate region, and the method requires a complicated structure.

To solve this, in the first example, the heating mechanism to heat the vaporization container 8 is formed by one heating power source 12 and one heater 9, and the control mechanism therefore is formed by one vaporization rate detector 10 and one vaporization rate controller 11 as shown in FIG. 3A. In this way, the heating mechanism and the control mechanism serve as a single system. The heater 9 is formed of one hot wire wound in spirals around an outer surface of the vaporization container 8. The heater 9 is disposed in such a manner that its pitch is denser on the release holes 13 side than on the vaporization container 7 side, by winding the heater 9 densely around an upper portion (the release holes 13 side) of the vaporization container 8 and sparsely around a lower portion (the vaporization material 7 side) thereof. Such structure allows single system heat control. Accordingly, it is possible to control the vaporization rate easily and stably over a long period of time, allowing formation of a thin film having a uniform film thickness and thus formation of an element having stable properties.

Figure 3B:
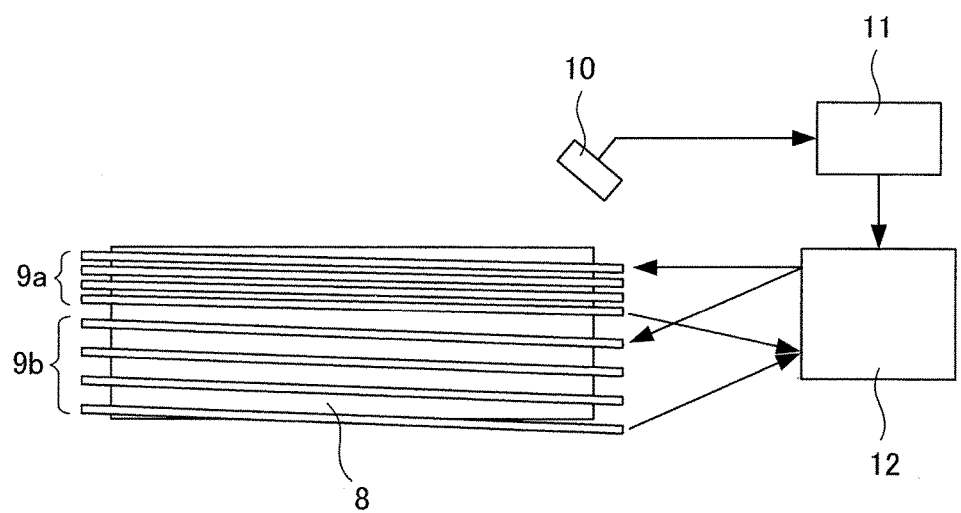
FIG. 3B is a modification of the configuration.

Meanwhile, since the heater 9 is wound around the outer surface of the vaporization container 8 multiple times, one heater may not provide a sufficient output if a required overall length exceeds a usable heater length. In such case, multiple heaters may be used. When multiple heaters are to be used, the heaters are similarly wound around the outer surface of the vaporization container 8. For example, as shown in FIG. 3B, two heaters may be used which are a heater 9a wound densely on an upper portion side and a heater 9b wound sparsely on a lower portion side. In this case, the heaters 9a and 9b are connected to each other in parallel or series so that power is fed thereto using one heating power source 12. This structure also allows single system heat control. Accordingly, it is possible to control the vaporization rate easily and stably over a long period of time, allowing formation of a thin film having a uniform film thickness and thus formation of an element having stable properties.

In general, individual heaters differ from each other in resistance even when they have the same length. Thus, using multiple heaters requires different powers. However, by winding the heaters 9a and 9b around the outer surface of the vaporization container 8 for example as shown in FIG. 3b, both heaters 9a and 9b can be disposed in the longitudinal direction of the vaporization container 8. Accordingly, even in the case of using multiple heaters, an influence in heating by the difference between the heaters 9a and 9b does not appear in the longitudinal direction of the vaporization container 8. Hence, the temperature distribution of the vaporization container 8 in its longitudinal direction can be made uniform.

Figure 4A:
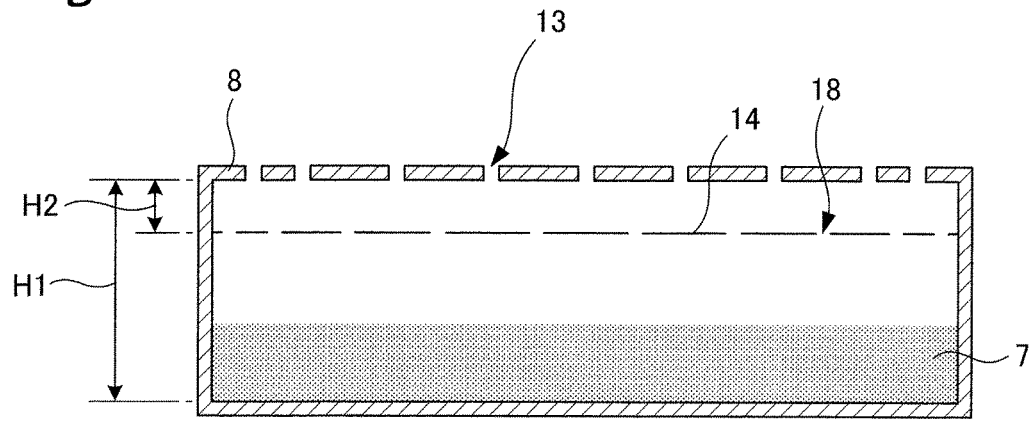
FIGS. 4A to 4C are diagrams showing an example of the structure of the vaporization container of the vacuum vapor deposition apparatus which carries out a vacuum vapor deposition method according to the present invention.
Figure 4B:
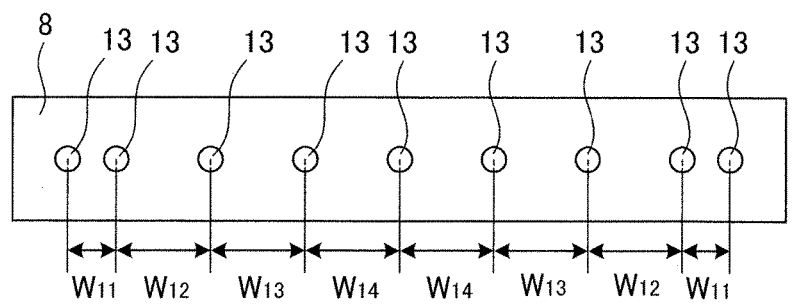
Figure 4C:
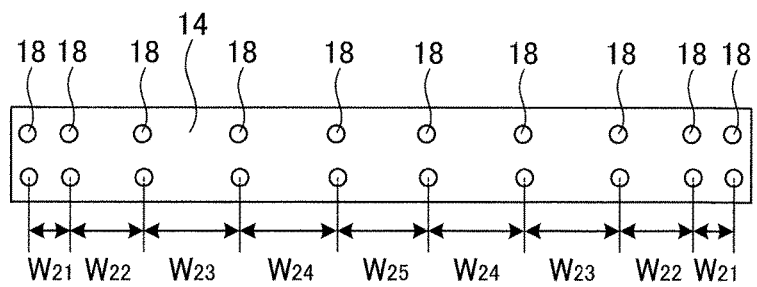

Next, the arrangement of the release holes 13 and the passage holes 18 in the current plate 14 in the first example will be described with reference to FIGS. 4A to 4C. FIG. 4A is a cross-sectional view of the vaporization container 8 in its longitudinal direction. FIG. 4B is a top view of the vaporization container 8. FIG. 4C is a top view of the current plate 14. In the following description, the amount of vapor vaporized from the vaporization material 7 itself will be called a "vaporization amount", whereas the amount of vapor other than that such as the amount of vapor in the release holes 13 and in the passage holes 18 will be called a "vapor amount" to make a clear distinction therebetween.

The multiple release holes 13 are formed in an upper surface (surface on the substrate 4 side) of the vaporization container 8 linearly in the longitudinal direction of the vaporization container 8. All the release holes 13 have a circular shape with the same diameter (with the same area). The release holes 13 are arranged such that the intervals therebetween would be denser toward both end portions from the center of the vaporization container 8 in its longitudinal direction. In this way, conductance by the release hole 13 becomes larger toward both end portions of the vaporization container 8. Assuming that the intervals between the release holes 13 from each end side to the center are $W_{11}$, $W_{12}$, $W_{13}$, and $W_{14}$ in FIG. 4B for example, the intervals $W_{13}$ and $W_{14}$ near the center are equivalent, and the intervals $W_{11}$, $W_{12}$, $W_{13}$, and $W_{14}$ have a relationship of $W_{14} \approx W_{13} > W_{12} > W_{11}$ from the center to each end side.

The vaporization source 20 is a linear-shaped vaporization source. Thus, as for the film thickness distribution on the substrate 4, the film thickness distribution in the board width direction should be taken into consideration. The linear vaporization source 20 may be assumed as what is obtained by arranging many point vaporization sources. For this reason, the thickness distribution, in the board width direction of the substrate 4, of a film formed by the linear vaporization source 20 can be calculated based on geometric superposition of amounts of vapor released from the many point vaporization sources. Using this fact, a vapor amount necessary for each assumptive point vaporization source on the vaporization source 20 is calculated so that the film thickness distribution in the board width direction of the substrate 4 would be uniform. Based on the calculated vapor amounts, conductance on the upper surface of the vaporization container 8 is calculated per unit length. Once conductance is calculated per unit length, conductance of each of the release holes 13 can be calculated based on the diameter and length of the release hole 13 and the average speed of vaporized molecules (see Gorou Tominaga, Hiroo Kumagai, "Shinkuu no Butsuri to Ouyou," Shokabo Publishing Co., Ltd, 1970, or the like for example). Accordingly, the arrangement intervals between the release holes 13 in the longitudinal direction of the vaporization container 8 are calculated.

Calculation of the arrangement intervals of the release holes 13 in the longitudinal direction of the vaporization container 8 indicates as follows. The arrangement intervals between the release holes 13 on both end sides need to be denser than the arrangement intervals between the release holes 13 on the center side (i.e., conductance per unit length needs to be larger on both end sides than on the center side), in order to make the film thickness distribution uniform in the board width direction of the substrate 4. For this reason, in the first example, the intervals have the relationship of $W_{14} \approx W_{13} > W_{12} > W_{11}$ as mentioned above. It should be noted that such arrangement intervals of the release holes 13 are set under the assumption that the vapor amount of the vaporization material 7 immediately below the release holes 13 is uniform. However, in reality, even when each vaporization amount per unit length of the vaporization material 7 itself is uniform, diffusion of the vapor reduces the vapor amounts of the vaporization material 7 on both end sides of the vaporization container 8 immediately below the release holes 13. Thus, even with denser arrangement intervals of the release holes 13 on both end sides (or with larger conductance on both end sides), the vapor amounts on both end sides of the vaporization container 8 are smaller than the estimated amounts. This hinders improvement of the film thickness distribution in the board width direction of the substrate 4.

Moreover, in a case of an elongated vaporization container 8, a variation in temperature of the vaporization container 8 and/or a change in state of the vaporization material 7 itself may largely vary a vaporization state, which may possibly make the vaporization amount nonuniform in the longitudinal direction of the vaporization container 8. Particularly, when the vaporization material 7 is an organic material, the state of the material maybe changed significantly by a temperature variation. In such case, the vaporization amount becomes nonuniform in the longitudinal direction, and, additionally, the vaporization material 7 maybe left uneven along with consumption of the vaporization material 7. This, as a result, makes the vaporization amount even more nonuniform in the longitudinal direction.

To solve this, in the first example, the current plate 14 having the passage holes 18 through which the vapor of the vaporization material 7 passes is provided inside the vaporization container 8 so that the vapor amounts of the vaporization material 7 immediately below the release holes 13 are made uniform. With this configuration, it is possible to handle nonuniform vaporization amounts of the vaporization material 7 in the longitudinal direction. Hereinafter, the structure of the current plate 14 will be described with reference to FIG. 4C.

The current plate 14 is placed between the release holes 13 and the vaporization material 7 inside the vaporization container 8 so as to separate the release holes 13 side and the vaporization material 7 side. The multiple passage holes 18 are provided to penetrate through the current plate 14 and formed to be aligned in two straight lines extending in the longitudinal direction of the current plate 14. All the passage holes 18 have a circular shape with the same diameter (with the same area). The passage holes 18 are arranged such that the intervals therebetween would be denser toward both end portions from the center of the current plate 14 in its longitudinal direction. In this way, conductance by the passage holes 18 is made proportional to conductance by the release holes 13. Assuming that the intervals between the passage holes 18 from each end side to the center are $W_{21}$, $W_{22}$, $W_{23}$, $W_{24}$, and $W_{25}$ in FIG. 4C for example, the intervals $W_{23}$, $W_{24}$, and $W_{25}$ near the center are mutually equivalent, and the intervals $W_{21}$, $W_{22}$, $W_{23}$, $W_{24}$, and $W_{25}$ have a relationship of $W_{25} \approx W_{24} \approx W_{23} > W_{22} > W_{21}$ from the center to each end side.

The passage holes 18 are arranged such that the release holes 13 and the passage holes 18 are not aligned collinearly when viewed from the surface of the vaporization material 7, for the following reason. The vaporization material 7 may be a material that is easy to bump (splash), such as an organic material. When such material bumps, the above arrangement prevents the vapor generated by the bumping from directly passing the passage holes 18 and the release holes 13 to directly adhere to the substrate 4. Since the arrangement prevents vapor generated by bumping from directly adhering to the substrate 4, it is possible to significantly improve a product quality.

It seems that the vapor amounts of the vaporization material 7 immediately below the release holes 13 should become uniform if the passage holes 18 are arranged to have equal intervals therebetween. However, this is also under the assumption that the vapor amounts of the vaporization material 7 below the current plate 14 are uniform. In reality, immediately below the current plate 14, the vapor amounts of the vaporization material 7 on both end sides of the vaporization container 8 decrease as well. Thus, the amounts of vapor passing through the passage holes 18 on both end sides of the current plate 14 are smaller than the estimated amounts. As a result, even with denser arrangement intervals of the release holes 13 on both end sides (or with larger conductance on both end sides), the amounts of vapor passing through the release holes 13 on both end sides of the vaporization container 8 are smaller than the estimated amounts. This hinders improvement of the film thickness distribution in the board width direction of the substrate 4. Moreover, when there is a variation in temperature of the vaporization container 8, a change in state of the vaporization material 7, and/or an unevenness in the vaporization material 7, the vaporization amounts of the vaporization material 7 become nonuniform in the longitudinal direction. As a result, the film thickness distribution in the board width direction of the substrate 4 is deteriorated.

Thus, the arrangement intervals between the passage holes 18 are calculated in basically the same way as the arrangement intervals between the release holes 13. For example, a vapor amount necessary for each assumptive point vaporization source on the current plate 14 is calculated so that the vapor amounts immediately below the release holes 13 would be uniform. Based on the calculated vapor amounts, conductance on the upper surface of the current plate 14 is calculated per unit length. Then, based on the calculated conductance per unit length and conductance of each of the release holes 18, the arrangement intervals between the passage holes 18 in the longitudinal direction of the current plate 14 are calculated. Calculation of the arrangement intervals between the passage holes 18 in the longitudinal direction of the current plate 14 indicates as follows. The arrangement intervals between the passage holes 18 on both end sides need to be denser than the arrangement intervals between the passage holes 18 on the center side (i.e., conductance per unit length needs to be larger on both end sides than on the center side), in order to make uniform the vapor amounts immediately below the release holes 13. For this reason, in the first example, the intervals have the relationship of $W_{25} \approx W_{24} \approx W_{23} > W_{22} > W_{21}$ as mentioned above. Accordingly, the arrangement intervals between the release holes 13 and the arrangement intervals between the passage holes 18 come to have the same arrangement tendency. Thereby, as conductance per unit length in the longitudinal direction, conductance by the passage holes 18 is made proportional to conductance by the release holes 13.

In FIG. 4B described above, the arrangement intervals of the release holes 13 having the same diameter are changed to alter conductance per unit length in the vaporization container 8. However, the arrangement intervals between the release holes 13 may be set at a fixed length, and, instead, the sizes of the release holes 13 may be changed to alter conductance per unit length.

In FIG. 4C described above, the arrangement intervals of the passage holes 18 having the same diameter are changed to alter conductance per unit length for the current plate 14. However, the arrangement intervals between the passage holes 18 may be set at a fixed length, and, instead, the sizes of the passage holes 18 may be changed to alter conductance per unit length.

Further, the release holes 13 and the passage holes 18 each have a circular shape in FIGS. 4B and 4C described above, but may have a square shape, an elliptic shape, a rectangular shape, or the like. Furthermore, one release hole 13 is associated with two passage holes 18 but may be associated with one or otherwise many (3 or more) passage holes 18.

According to the above structure, the current plate 14 is provided inside the vaporization container 8, and the release holes 13 in the vaporization container 8 and the passage holes 18 in the current plate 14 are arranged to have the positional relationship mentioned above. Accordingly, the vapor amounts immediately below the release holes 13 can be made uniform, which in turn increases the amount of vapor flow on each end side compared to that on the center side. This suppresses a decrease in film thickness at both end portions of the substrate 4 and thus makes uniform the film thickness distribution in the board width direction of the substrate 4. Consequently, a thin film having a desired uniform film thickness distribution can be obtained.

Figure 5A:
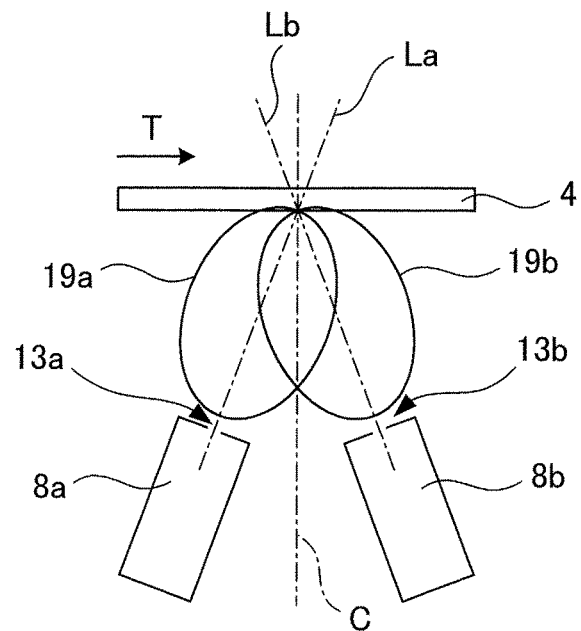
FIG. 5A is a diagram for explaining how two vaporization sources are placed in general.
Figure 5B:
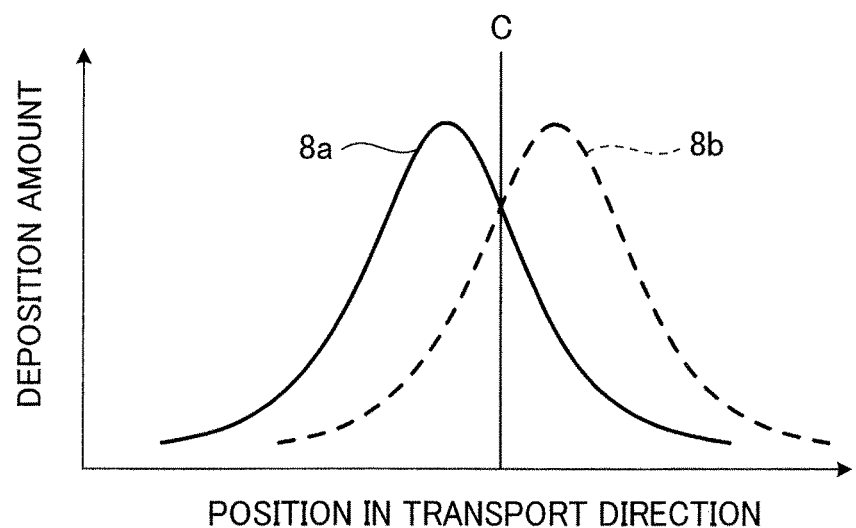
FIG. 5B is a graph showing the profiles of deposition amounts at certain positions in a transport direction regarding the placement.
Figure 6A:
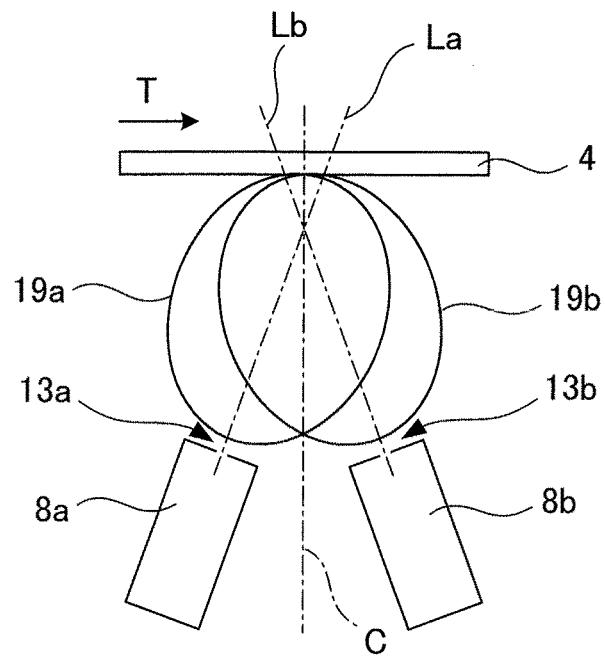
FIG. 6A is a diagram for explaining how two vaporization sources are placed in the vacuum vapor deposition apparatus which carries out a vacuum vapor deposition method according to the present invention.
Figure 6B:
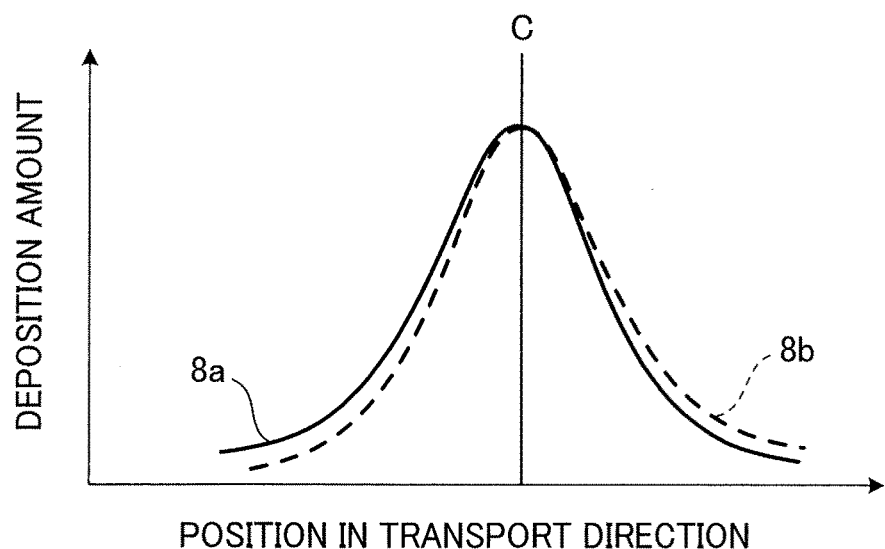
FIG. 6B is a graph showing the profiles of deposition amounts at certain positions in the transport direction regarding the placement.
Figure 7:
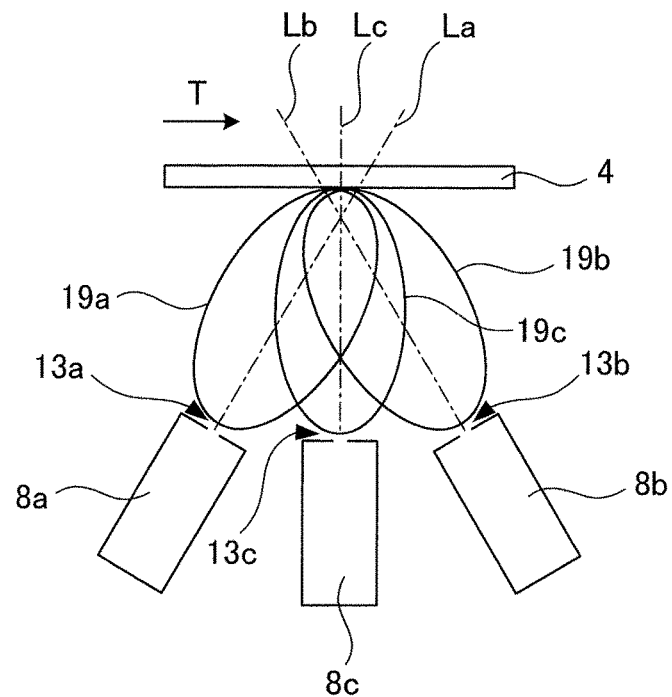
FIG. 7 is a diagram for explaining how three vaporization sources are placed in the vacuum vapor deposition apparatus which carries out a vacuum vapor deposition method according to the present invention.

In addition, in the vacuum vapor deposition apparatus which carries out a vacuum vapor deposition method of the first example, the vaporization sources are placed as shown in FIG. 6A or 7 to be described later so that the mixing ratio in a deposited thin film obtained by multi-source simultaneous deposition would remain constant in the film thickness direction. FIG. 5A is a diagram for explaining how two vaporization sources are placed in general, and FIG. 5B is a graph showing the profile of the deposition amounts at certain positions in the transport direction regarding the placement. FIG. 6A is a diagram for explaining how two vaporizations sources are placed in the first example, and FIG. 6B is a graph showing the profile of the deposition amounts at certain positions in the transport direction regarding the placement. FIG. 7 is a diagram for explaining how three vaporization sources are placed in the first example. Note that description will be given while showing only the substrate and the vaporization containers inside the vaporization sources in FIGS. 5A to 7 for simple illustration.

In general, in a case of two vaporization sources (vaporization containers), vaporization containers 8a and 8b are placed to tilt in such a manner that normal lines La and Lb from the centers of release holes 13a and 13b of the vaporization containers 8a and 8b, respectively, coincide with one another on a deposition surface of the substrate 4, as shown in FIG. 5A. In a case of such placement, calculation of equal-thickness surfaces 19a and 19b for the vaporization containers 8a and 8b indicates as follows, each of the equal-thickness surfaces 19a and 19b being where the deposition amount of the vapor of vaporization material released from a corresponding one of release holes 13a and 13b is the same per unit time. Specifically, the equal-thickness surfaces 19a and 19b intersect with each other at a position where the deposition surface of the substrate 4 intersects with the normal lines La and Lb (also intersecting with a center line C showing the apparatus center in FIG. 5A).

According to the cosine law, the equal-thickness surfaces 19a and 19b are desirably spherical or ellipsoidal (see Tatsuo Asamaki, Hakumaku Sakusei no Kiso, The Nikkan Kogyo Shimbun, Ltd., 2005, or the like for example). In the case of FIG. 5A, the equal-thickness surfaces 19a and 19b are depicted as ellipsoidal. In addition, the equal-thickness surfaces 19a and 19b are similar to how soap bubbles inflate while becoming thinner. The equal-thickness surfaces 19a and 19b indicate positions where adhesion of equal film thickness takes place. Even when the vaporization containers 8a and 8b have an uneven mixing ratio (an uneven ratio of deposition amounts or film thicknesses), the equal-thickness surfaces are depicted as having the same shape and size. This means for example that the equal-thickness surface 19a represents a film thickness of 100 nm, the equal-thickness surface 19b represents a film thickness of 1 nm, and thus a film having a mixing ratio of 100:1 is formed.

From FIG. 5A, it can be seen that the equal-thickness surfaces 19a and 19b expand from the vaporization containers 8a and 8b, respectively, and come in contact with the substrate 4 before intersecting with each other on the substrate 4. The positions where the equal-thickness surfaces 19a and 19b first come in contact with the substrate 4 are positions where the thicknesses of the films deposited from the vaporization containers 8a and 8b become the largest.

Measurement of the deposition amounts in the height direction of the substrate 4 at each position in a transport direction T shows the following. As shown in FIG. 5B, the deposition amounts with the vapors of the respective vaporization materials take their largest values at different positions. With these positions as the peaks, the deposition amounts each decrease approximately symmetrically. Note that FIG. 5B is a graph showing deposition amounts (corresponding to film thicknesses) within such a range that the distance between the substrate 4 and the vaporization containers 8a and 8b is 1, and the distance in the transport direction is 4. The deposition amounts from the vaporization containers 8a and 8b are different from each other, but their largest deposition amounts are illustrated as being equal for the sake of comparison. As is apparent from FIG. 5B, although the mixing ratio in the formed film is the same as a whole, the mixing ratio deviates at any position in the transport direction, and the amounts of the deviation are large.

The substrate 4 is subjected to simultaneous deposition while moving in the transport direction T. Thus, the profile shown in FIG. 5B corresponds to the mixing ratio in the film thickness direction of the thin film formed by the simultaneous deposition, and the deviated mixing ratio indicates that the mixing ratio of the deposited vaporization materials vary in the film thickness direction of the deposited thin film. For this reason, the film is hardly a homogeneous thin film. In recent years, there have been demands to reduce manufacturing cost by improving the utilization of expensive organic materials, and also to improve productivity through high-rate film formation. These demands have been satisfied by reducing the distances between vaporization sources and a substrate. This in turn increases the amount of deviation in the mixing ratio. Because the equal-thickness surfaces are actually almost spherical, the amount of deviation in the mixing ratio appears to be even more remarkable.

On the other hand, in the first example, in a case of two vaporization sources (vaporization containers) (in a case of double-source simultaneous deposition), the vaporization containers 8a and 8b are placed to tilt in such a manner that contact points of the equal-thickness surfaces 19a and 19b, at which they come in contact with the deposition surface of the substrate 4, would coincide with each other on the deposition surface of the substrate 4, as shown in FIG. 6A. For example, to form a luminescent layer of an organic EL element, a host material and a luminescent material as vaporization materials need to be mixed and deposited. In this case, the equal-thickness surface 19a and the equal-thickness surface 19b are calculated in accordance with the mixing ratio of the host material and the luminescent material. Here, the equal-thickness surface 19a indicates where the deposition amount of the vapor of the host material released from the release holes 13a is the same per unit time, and the equal-thickness surface 19b indicates where the deposition amount of the vapor of the luminescent material released from the release holes 13b is the same per unit time. Then, the vaporization containers 8a and 8b are placed to tilt in such a manner that contact points of the obtained equal-thickness surfaces 19a and 19b, at which they come in contact with the deposition surface of the substrate 4, would coincide with each other on the deposition surface of the substrate 4.

The equal-thickness surfaces 19a and 19b described above can be calculated through simulations of vapor flux distributions using parameters such as the temperatures, positions, and inclinations of the vaporization containers 8a and 8b in accordance with the types of vaporization materials. For example, an equal-thickness surface from one release hole 13 is a spherical or ellipsoidal matter (whose cross section is circular or elliptic) having the release hole 13 as its origin. Then, since the multiple release holes 13a and 13b are arranged linearly in the respective vaporization containers 8a and 8b, the equal-thickness surfaces 19a and 19b may be regarded as continuously-connected spherical or ellipsoidal matters obtained by partially superposing the spherical or ellipsoidal matters on one another in the arrangement directions of the respective multiple release holes 13a and 13b. That is, the equal-thickness surfaces 19a and 19b may be regarded as elongated matters having circular or elliptic cross sections. Therefore, when the contact points of the equal-thickness surfaces 19a and 19b, at which they come in contact with the deposition surface of the substrate 4, coincides with each other on the deposition surface of the substrate 4 at any position in the arrangement directions of the multiple release holes 13a and 13b, the contact points of the equal-thickness surfaces 19a and 19b, at which they come in contact with the deposition surface of the substrate 4, is regarded as substantially coinciding with each other on the deposition surface of the substrate 4 at all the positions in the arrangement directions of the multiple release holes 13a and 13b.

Meanwhile, under the same conditions, the sizes of the equal-thickness surfaces 19a and 19b remain the same regardless of the types of vaporization materials or film thicknesses but differ from each other depending on the distances between the vaporization sources and the substrate. Thus, by using the vaporization rate detectors 10 and the vaporization rate controllers 11 to detect and control the deposition amounts (vaporization rates) from the vaporization containers 8a and 8b, respectively, films can be formed with a desired mixing ratio. Nonetheless, it is desirable that the sizes of the equal-thickness surfaces 19a and 19b of the vaporization materials be approximately equal to each other. In this way, it is possible to place the vaporization containers 8a and 8b symmetrically with respect to the center line C, and also to obtain deposition amount profiles of extremely similar shapes as shown in FIG. 6B to be described below.

Measurement of the deposition amounts in the height direction of the substrate 4 at each position in the transport direction T shows the following. As shown in FIG. 6B, the deposition amounts with the vapors of the respective vaporization materials both take their largest values at a position where the deposition surface of the substrate 4 intersect with the center line C. With these positions as the peaks, the deposition amounts each decrease symmetrically. The mixing ratio at the centerline C position is a desired mixing ratio. The mixing ratios at the other positions deviate by a quite small margin. Nonetheless, the deviated amounts are significantly smaller than those in FIG. 5B. The substrate 4 is subjected to simultaneous deposition while moving in the transport direction T. Thus, the profile shown in FIG. 6B corresponds to the mixing ratio in the film thickness direction of the thin film formed by the simultaneous deposition. This profile indicates that a variation in mixing ratio of the deposited vaporization materials can be significantly suppressed in the film thickness direction of the deposited thin film. In sum, the first example makes it possible to keep the mixing ratio in the film thickness direction substantially constant and thus to form a homogeneous thin film, thereby enabling manufacturing of an organic EL element or the like with a higher quality.

Here, to cause the contact points of the equal-thickness surfaces 19a and 19b, at which they come in contact with the deposition surface of the substrate 4, to coincide with each other on the deposition surface of the substrate 4 may be expressed as follows. Specifically, with reference to FIG. 6B for explanation, a position in the transport direction where the deposition amount of the vaporization material vaporized from the vaporization container 8a reaches largest in the height direction of the substrate 4 coincides, on the deposition surface of the substrate 4, with a position in the transport direction where the deposition amount of the vaporization material vaporized from the vaporization container 8b reaches largest in the height direction of the substrate 4.

Further, in a case of three vaporization sources (vaporization containers) (in a case of triple-source simultaneous deposition) as shown in FIG. 7, the normal lines La, Lb, and Lc from the centers of the release holes 13a, 13b, and 13c of the vaporization containers 8a, 8b, and 8c, respectively, should not coincide with one another on the deposition surface of the substrate 4. Instead, equal-thickness surfaces 19a, 19b, and 19c are calculated for the vaporization containers 8a, 8b, and 8c, respectively. Here, each of the equal-thickness surfaces 19a, 19b, and 19c indicates where the deposition amount of the vapor of the vaporization material released from corresponding one of the release holes 13a, 13b, and 13c is the same per unit time. Then, the vaporization containers 8a, 8b, and 8c are placed to tilt in such a manner that contact points of the equal-thickness surfaces 19a, 19b, and 19c, at which they come in contact with the deposition surface of the substrate 4, would all coincide with one another on the deposition surface of the substrate 4.

According to this structure, as in the case of the double-source simultaneous deposition, the mixing ratio in the film thickness direction is kept substantially constant and thus a homogeneous thin film is formed. Thereby, an organic EL element with a higher quality can be manufactured. Meanwhile, to form a luminescent layer of an organic EL element by triple-source simultaneous deposition, the materials in the vaporization containers 8a and 8b on both sides should be host materials whereas the material in the vaporization container 8c in the middle should be a luminescent material as dopant.

SECOND EXAMPLE

Figure 8:
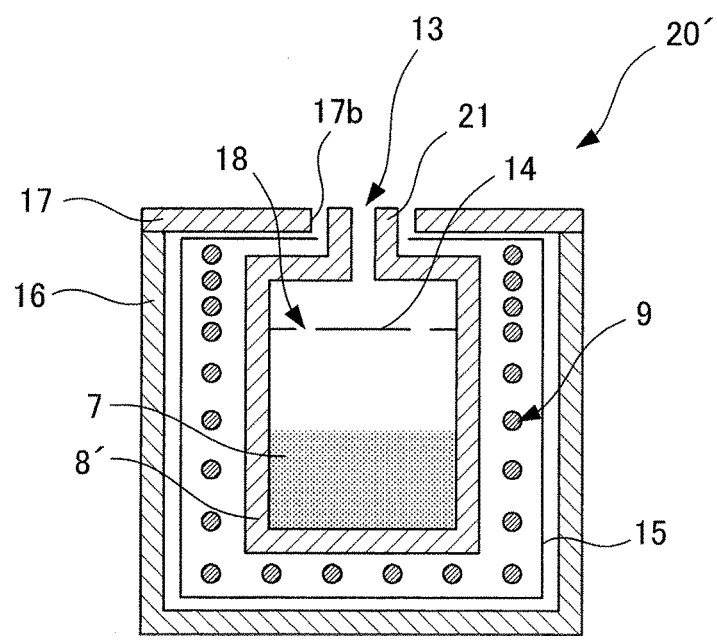
FIG. 8 is a cross-sectional view showing another example (second example) of the linearly-shaped vaporization sources of the vacuum vapor deposition apparatus which carries out a vacuum vapor deposition method according to the present invention.

In addition to the vaporization source shown in FIG. 2, a vaporization source shown in FIG. 8 is also applicable to the present invention. In that case, the other configurations may be the same as those described in the first example, and thus only the vaporization source is illustrated here. FIG. 8 is a cross-sectional view taken along a plane perpendicular to the longitudinal direction of the linear-shaped vaporization source.

As shown in FIG. 8, a vaporization source 20' of a second example has approximately the same structure as that of the vaporization source 20 shown in FIG. 2. However, in this structure, nozzles 21 projecting up to an upper surface of the heat insulating plate 17 are provided to an upper surface (surface on the substrate 4 side) of a vaporization container 8', and the release holes 13 are provided to penetrate through the nozzles 21. With the nozzles 21, the position of the upper plane of each release hole 13 in its height direction is made as high as the position of the upper surface of the heat insulating plate 17 in its height direction. This eliminates a possibility of the vapor of the vaporization material 7 adhering to the heat insulating plate 17. Accordingly, opening portions 17b in the heat insulating plate 17 do not need to be tapered and, instead, are formed to penetrate vertically through the heat insulating plate 17. The other configurations are the same as those of the vaporization source 20 shown in FIG. 2, and thus the same components in FIG. 8 are denoted by the same reference signs and description thereof will be omitted.

Figure 9:
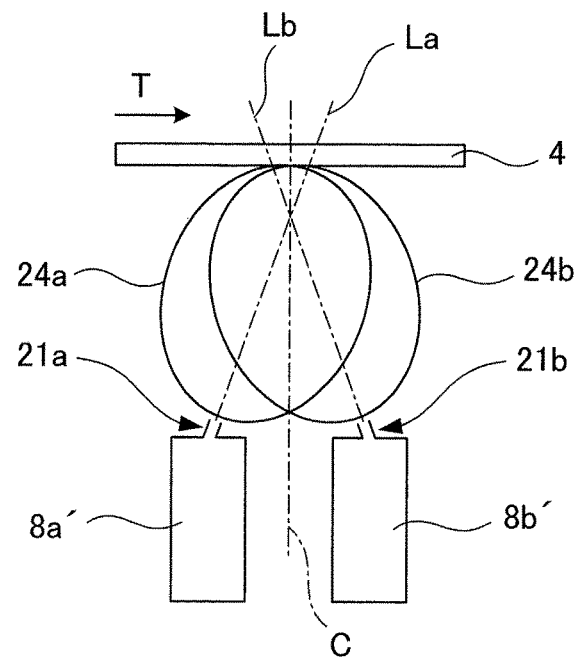
FIG. 9 is a diagram for explaining how two vaporization sources with nozzles are placed in the vacuum vapor deposition apparatus which carries out a vacuum vapor deposition method according to the present invention.
Figure 10:
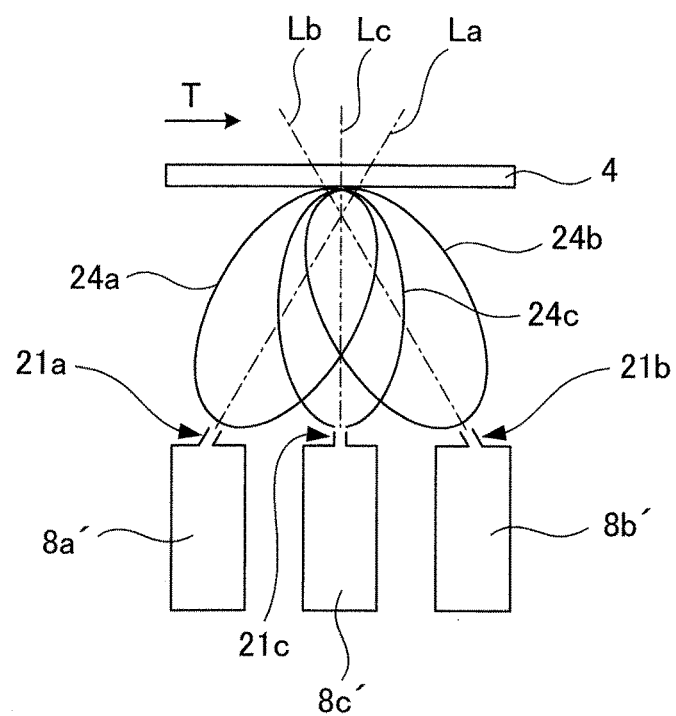
FIG. 10 is a diagram for explaining how three vaporization sources with nozzles are placed in the vacuum vapor deposition apparatus which carries out a vacuum vapor deposition method according to the present invention.

In addition, in the second example, the vaporization sources are placed as shown in FIG. 9 or 10 so that the mixing ratio in a deposited thin film obtained by multi-source simultaneous deposition would remain constant in the film thickness direction. FIG. 9 is a diagram for explaining how two vaporization sources are placed in the second example. FIG. 10 is a diagram for explaining how three vaporization sources are placed in the second example. Note that description will be given also in FIGS. 9 and 10 while showing only the substrate and the vaporization containers inside the vaporization sources for simple illustration.

In the second example, in a case of two vaporization sources (vaporization containers) (in a case of double-source simultaneous deposition), equal-thickness surfaces 24a and 24b are calculated for the vaporization containers 8a' and 8b', respectively. Here, each of the equal-thickness surfaces 24a and 24b indicates where the deposition amount of the vapor of the vaporization material released from corresponding one of nozzles 21a and 21b is the same per unit time. Then, as shown in FIG. 9, vaporization containers 8a' and 8b' are placed to stand vertically and also nozzles 21a and 21b thereof are tilted in such a manner that contact points of equal-thickness surfaces 24a and 24b, at which they come in contact with the deposition surface of the substrate 4, would coincide with each other on the deposition surface of the substrate 4.

The equal-thickness surfaces 24a and 24b are calculated for the vaporization containers 8a' and 8b', respectively. Under the same conditions, the sizes of the equal-thickness surfaces 24a and 24b remain the same regardless of the types of vaporization materials or film thicknesses but differ from each other depending on the distances between the vaporization sources and the substrate. Thus, by using the vaporization rate detectors 10 and the vaporization rate controllers 11 to detect and control the deposition amounts (vaporization rates) from the vaporization containers 8a' and 8b', respectively, films can be formed with a desired mixing. Nonetheless, it is desirable that the sizes of the equal-thickness surfaces 24a and 24b of the vaporization materials be approximately equal to each other. In this way, it is possible to place the vaporization containers 8a' and 8b' symmetrically with respect to the center line C, and also to obtain deposition amount profile as shown in FIG. 6B described above.

In the second example too, to cause the contact points of the equal-thickness surfaces 24a and 24b, at which they come in contact with the deposition surface of the substrate 4, to coincide with each other on the deposition surface of the substrate 4 means the same as what is explained above with reference to FIG. 6B. Specifically, a position in the transport direction where the deposition amount of the vaporization material vaporized from the vaporization container 8a' reaches largest in the height direction of the substrate 4 coincides, on the deposition surface of the substrate 4, with a position in the transport direction where the deposition amount of the vaporization material vaporized from the vaporization container 8b' reaches largest in the height direction of the substrate 4. According to this structure, the mixing ratio in the film thickness direction is kept substantially constant and thus a homogeneous thin film is formed. Thereby, an organic EL element with a higher quality can be manufactured.

Further, in a case of three vaporization sources (vaporization containers) (in a case of triple-source simultaneous deposition), the normal lines La, Lb, and Lc from the centers of the nozzles 21a, 21b, and 21c of the vaporization containers 8a', 8b', and 8c', respectively, should not coincide with one another on the deposition surface of the substrate 4. Instead, the equal-thickness surfaces 24a, 24b, and 24c are calculated for the vaporization containers 8a', 8b', and 8c', respectively. Here, each of the equal-thickness surfaces 24a, 24b, and 24c indicates where the deposition amount of the vapor of the vaporization material released from corresponding one of the nozzles 21a, 21b, and 21c is the same per unit time. Then, as shown in FIG. 10, the vaporization containers 8a', 8b', and 8c' are placed to stand vertically and also the nozzles 21a, 21b, and 21c thereof are tilted in such a manner that contact points of the equal-thickness surface 24a, 24b, and 24c, at which they come in contact with the deposition surface of the substrate 4, would all coincide with one another on the deposition surface of the substrate 4.

According to this structure, as in the case of the double-source simultaneous deposition, the mixing ratio in the film thickness direction is kept substantially constant and thus a homogeneous thin film is formed. Thereby, an organic EL element with a higher quality can be manufactured. Meanwhile, to form a luminescent layer of an organic EL element by triple-source simultaneous deposition, the materials in the vaporization containers 8a'and 8b'on both sides should be host materials whereas the material in the vaporization container 8c in the middle should be a luminescent material as dopant. In the second example, the vaporization containers 8a', 8b', and 8c' do not need to be placed in a tilted manner, and thus can be installed easily.

A vacuum vapor deposition method according to the present invention is suitable particularly for a case where the deposition target is a large substrate, and also suitable for a case where the vaporization materials are organic materials.

1 VACUUM CHAMBER
2 VALVE

3 VACUUM PUMP
4 SUBSTRATE
5 DRIVE SOURCE
6 TRANSPORT ROLLER
7 VAPORIZATION MATERIAL
8, 8a, 8b, 8a', 8b' VAPORIZATION CONTAINER
9 HEATER
10 VAPORIZATION RATE DETECTOR
11 VAPORIZATION RATE CONTROLLER
12 HEATING POWER SOURCE
13, 13a, 13b, 13c RELEASE HOLE
14 CURRENT PLATE
15 RADIATION PREVENTIVE PLATE
16 WATER-COOLING JACKET
17 HEAT INSULATING PLATE
18 PASSAGE HOLE
20, 20' VAPORIZATION SOURCE
19a, 19b, 19c EQUAL-THICKNESS SURFACE
21, 21a, 21b, 21c NOZZLE
24a, 24b, 24c EQUAL-THICKNESS SURFACE

The invention claimed is:

1. A vacuum vapor deposition method, comprising:
disposing a plurality of vaporization containers in a vacuum, each containing a vaporization material and having a plurality of release holes arranged linearly in arrangement directions parallel with each other in the plurality of vaporization containers;
moving a substrate or the vaporization containers relatively in a direction perpendicular to the arrangement directions;
calculating an equal-thickness surface corresponding to each of the release holes, the equal-thickness surface indicating a surface where a deposition amount of a vapor of the vaporization material released from the corresponding release hole is the same per unit time;
placing the vaporization containers in such a manner that contact points of equal-thickness surfaces, corresponding to release holes of the plurality of release holes that are directed toward each other in the plurality of vaporization containers, coincide with each other on a surface of the substrate, each of the contact points indicating where the corresponding equal-thickness surfaces come in contact with the surface of the substrate; and
heating the vaporization containers to evaporate or sublimate the vaporization materials so that vapors of the vaporization materials are released through the plurality of release holes, mixed together and deposited on an entire surface of the substrate.

2. The vacuum deposition method of claim 1, further comprising
defining a normal line from a center of each of the release holes; and
placing the vaporization containers in such a manner that the normal lines of the release holes cross at the vaporization containers side of the substrate and short of the substrate.

3. The vacuum deposition method of claim 2, further comprising
providing the release holes to penetrate through nozzles projecting from the vaporization containers,
placing the vaporization containers to stand vertically; and
tilting the nozzles in such a manner that the contact points of the equal-thickness surfaces of corresponding release holes that face each other all coincide with each other on the surface of the substrate.

4. The vacuum deposition method of claim 3, further comprising
placing a current plate inside of each of the vaporization containers, each of the current plates having a plurality of passage holes through which vapor of the vaporization materials passes; and
forming the plurality of passage holes and the plurality of release holes so as that conductance per unit length in the arrangement directions by the plurality of passage holes is proportional to conductance s per unit length in the arrangement directions by the plurality of release hole.

5. A vacuum vapor deposition method, comprising:
disposing a plurality of vaporization containers in a vacuum, each containing a vaporization material and having a plurality of release holes arranged linearly in arrangement directions parallel with each other in the plurality of vaporization containers;
moving a substrate or the vaporization containers relatively in a direction perpendicular to the arrangement directions;
calculating a peak deposition position on a surface of the substrate corresponding to each of the release holes, the peak deposition position indicating a position where a deposition amount of a vapor of the vaporization material released from the corresponding release hole is at a peak with respect to a relatively moving direction of the substrate;
placing the vaporization containers in such a manner that the peak deposition positions, with the release holes directed toward each other in the plurality of vaporization containers, all coincide with each other on the surface of the substrate; and
heating the vaporization containers to evaporate or sublimate the vaporization materials so that vapors of the vaporization materials are released through the plurality of release holes, as well as the vaporization materials are mixed together and deposited on an entire surface of the substrate.

6. The vacuum deposition method of claim 5, further comprising
defining a normal line from a center of each of the release holes; and
placing the vaporization containers in such a manner that the normal lines of the release holes cross at the vaporization containers side of the substrate and short of the substrate.

7. The vacuum deposition method of claim 6, further comprising
providing the release holes to penetrate through nozzles projecting from the vaporization containers,
placing the vaporization containers to stand vertically; and
tilting the nozzles in such a manner that the peak deposition positions of corresponding release holes that face each other all coincide with each other on the surface of the substrate.

8. The vacuum deposition method of claim 7, wherein,
placing a current plate inside of each of the vaporization containers, each of the current plates having a plurality of passage holes through which vapor of the vaporization materials passes; and
forming the plurality of passage holes and the plurality of release holes so as that conductance by the plurality of passage holes per unit length in the arrangement directions is proportional to conductance by the plurality of release holes per unit length in the arrangement directions.

* * * * *